United States Patent [19]

Tien et al.

[11] Patent Number: 5,517,131
[45] Date of Patent: May 14, 1996

[54] TTL INPUT BUFFER WITH ON-CHIP REFERENCE BIAS REGULATOR AND DECOUPLING CAPACITOR

[75] Inventors: Ta-Ke Tien; Chau-chin Wu, both of Cupertino; Richard C. Li, San Jose, all of Calif.

[73] Assignee: Integrated Device Technology, Inc., Santa Clara, Calif.

[21] Appl. No.: 295,322

[22] Filed: Aug. 23, 1994

Related U.S. Application Data

[62] Division of Ser. No. 929,872, Aug. 11, 1992, Pat. No. 5,376,843.

[51] Int. Cl.[6] .................................................. H03K 17/16
[52] U.S. Cl. ................................ 326/34; 326/71; 327/541
[58] Field of Search ............................... 326/32–34, 121, 326/71; 327/541

[56] References Cited

U.S. PATENT DOCUMENTS

| | | | |
|---|---|---|---|
| 4,656,373 | 4/1987 | Pons | 307/475 |
| 4,874,967 | 10/1989 | Deane | 307/296.8 |
| 4,876,465 | 10/1989 | Podkowa | 307/443 |
| 4,988,897 | 1/1991 | Jeong | 307/475 |
| 5,057,715 | 10/1991 | Larsen | 307/451 |
| 5,214,320 | 5/1993 | Truong | 307/443 |
| 5,376,843 | 12/1994 | Tien | 326/68 |

*Primary Examiner*—Edward P. Westin
*Assistant Examiner*—Andrew Sanders
*Attorney, Agent, or Firm*—Skjerven, Morrill, MacPherson, Franklin & Friel; Edward C. Kwok

[57] ABSTRACT

An input buffer insensitive to changes in supply voltage, temperature and other operational parameters comprises a decoupling capacitor and receives a reference voltage. In one embodiment, the input buffer comprises a CMOS inverter in which a PMOS transistor is provided to decouple the output signal from a fluctuation of the ground voltage ("ground bounce"). In one embodiment, a band gap type voltage regulator provides the reference voltage of the input buffer.

8 Claims, 2 Drawing Sheets

TTL INPUT BUFFER WITH ON-CHIP REFERENCE BIAS REGULATOR AND DECOUPLING CAPACITOR

This application is a division of application Ser. No. 07/929,872, filed Aug. 11, 1992 now U.S. Pat. No. 5,376,843.

BACKGROUND OF THE INVENTION

1. Field of the Invention

This invention relates to the design of integrated circuits; and, in particular, relates to the design of input buffers in integrated circuits.

2. Discussion of the Related Art

In most integrated circuits, logic or boolean states are encoded by voltage levels. For example, in integrated circuits using "positive logic" TTL levels, the logic "true" (i.e. boolean "1" or "high") state is represented in a signal by a voltage level above 2.2 volts, and the logic "false" (i.e. boolean "0" or "low") state is represented in a signal by a voltage level below 0.7 volts. Clearly, a logic circuit must correctly receive the logic states of its input signals to correctly and reliably operate.

An integrated circuit receives its input signals through input buffer circuits. An example of a typical complementary metal-oxide-semiconductor (CMOS) input buffer circuit is shown in FIG. 1. As shown in FIG. 1, an input buffer 100 is formed by a CMOS invertor comprising PMOS transistor 101, and NMOS transistor 102. The input signal is received on lead 103 and an output signal opposite in logic state to the input signal is provided on lead 104. The output signal is often buffered to be distributed to the rest of the integrated circuit.

In input buffer 100, when the voltage level of the Signal on input lead 103 exceeds a "threshold voltage", the output signal on lead 104 is pulled to logic low by NMOS transistor 102. Conversely, when the voltage level of the signal on input lead 103 falls below the threshold voltage, the output signal on lead 104 is pulled to logic high by PMOS transistor 101. This threshold voltage is determined by the supply voltage and the relative sizes of transistors 101 and 102. For example, in one implementation in which the supply voltage is 5 volts relative to ground, using a size ratio of 1:5 between PMOS transistor 101 and NMOS transistor 102, a 1.5 volt threshold voltage is achieved for the input buffer 100.

Input buffer 100 of FIG. 1 has a severe drawback in that the threshold voltage achieved is susceptible to variation due to changes in the operating environment (e.g. power supply and temperature variations) or fabrication conditions (e.g. input buffer 100's electrical characteristics). In particular, input buffer 100 is especially susceptible to "ground bounce", which is a momentary surge of the local "ground" voltage of the integrated circuit due to a large current being sunk momentarily by the integrated circuit. Under such condition, the threshold voltage of input buffer 100 may rise by as much as the ground bounce. Since the external input signal does not follow the ground bounce, this sudden surge in the threshold voltage may result in a logic high value in the input signal on input lead 103 being incorrectly received as a logic low value, thereby causing an undesirable result.

As mentioned above, other changes in operational and fabrication conditions can also affect the threshold voltage to result in incorrect operation of the integrated circuit. For example, process variations in a CMOS process can affect the PMOS and NMOS transistors differently so as to result in a threshold voltage deviated from its intended value. Temperature variations too can affect the PMOS and NMOS transistors disparately to result in a shift in threshold voltage from its intended threshold voltage. Further, in input buffer 100, variations in the supply voltage $V_{cc}$ can also cause a shift in the threshold voltage from its intended value, thereby affecting the speed of the input buffer.

Thus, an input buffer which maintains a substantially constant threshold voltage under changes in operational and fabrication conditions is highly desirable.

SUMMARY OF THE INVENTION

In accordance with the present invention, a structure and a method provide an input buffer which input threshold voltage is substantially independent of temperature variation, ground bounce noise and supply voltage fluctuation effects. The input buffer in the present invention also provides symmetrical rise and fall times.

In accordance with one aspect of the present invention, a reference voltage is used to set the input threshold voltage of an invertor. In one embodiment, the input buffer comprises (i) first and second serially connected PMOS transistor and (ii) an NMOS transistor forming, respectively, the pull-up and pull-down portions of a CMOS invertor. The output signal of the CMOS invertor is taken from the node which is common to the drain terminals of the NMOS transistor and the second PMOS transistor. The gate terminal of the second PMOS transistor, which is coupled to a reference voltage, is a control terminal of the CMOS invertor, such that the input threshold voltage of CMOS invertor is set by the reference voltage.

In accordance with another aspect of the present invention, a decoupling capacitor is provided between the control terminal discussed above and ground so as to prevent ground bounce from momentarily varying the input threshold voltage the input buffer.

In accordance with another aspect of the present invention, the reference voltage is generated by a bandgap voltage regulator which provides an output voltage substantially independent of supply voltage and temperature fluctuation effects.

In accordance with another aspect of the present invention, the means for coupling the reference voltage to the control terminal of the CMOS invertor is a second CMOS invertor substantially the same as the CMOS invertor ("first CMOS invertor") of the input buffer. The second CMOS invertor has its output terminal connected to its control terminal which, in turn is connected to the control terminal of the first CMOS invertor, so as to constrain the input threshold voltage of the first CMOS invertor to the reference voltage.

In accordance with another aspect of the present invention, a bandgap voltage regulator provides a constant current source and a constant voltage independent of temperature, device and supply voltage fluctuations. A constant current circuit uses two bipolar transistor to provide a constant current based substantially only on the base-to-emitter voltage of one of the bipolar transistors, and independent of supply voltage fluctuation.

The present invention is better understood upon consideration of the detailed description below and the accompanying drawings.

DETAILED DESCRIPTION OF THE PREFERRED EMBODIMENTS

Figure 1:
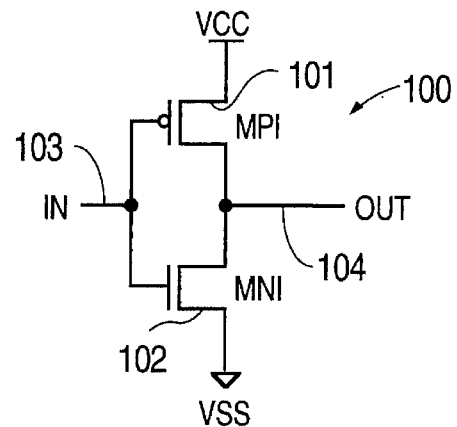
FIG. 1 shows a typical input buffer 100 formed by a CMOS invertor comprising PMOS transistor 101 and NMOS transistor 102.
Figure 2:
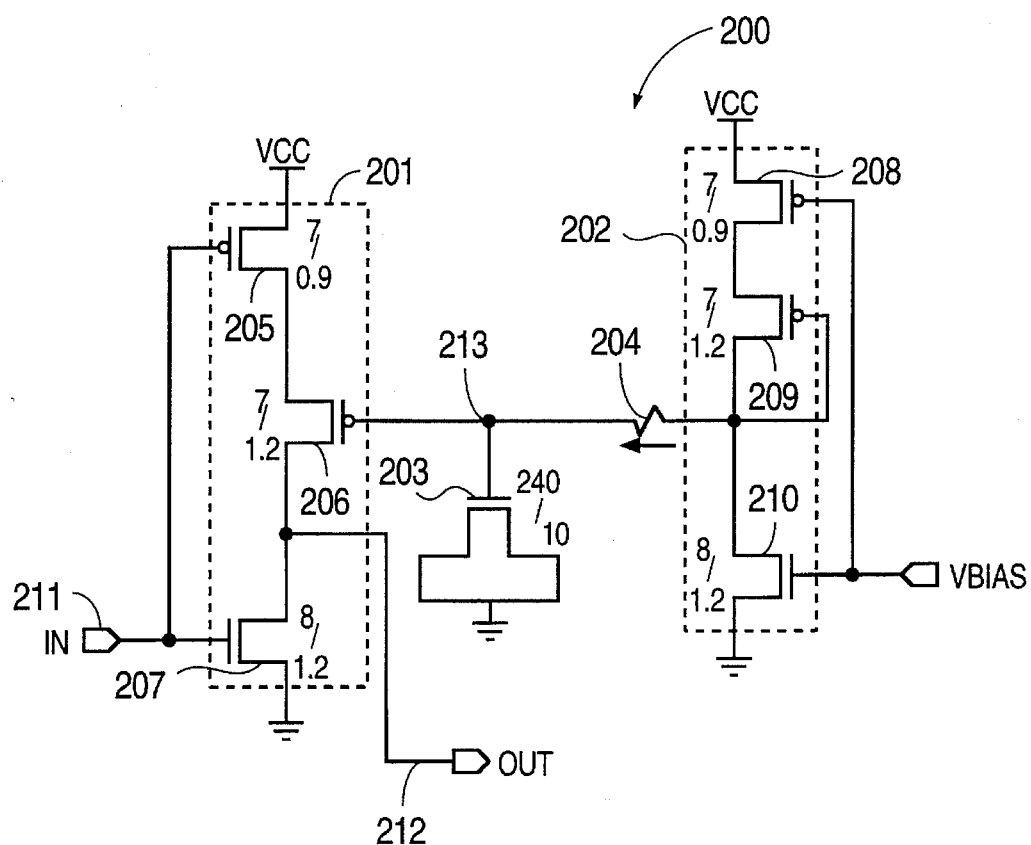
FIG. 2 shows an input buffer 200 receiving a reference voltage $V_{ref}$ in accordance with the present invention.

FIG. 2 shows an input buffer 200 in accordance with the present invention. As shown in FIG. 1, input buffer 200 comprises of two CMOS invertors 201 and 202, a decoupling metal-oxide-semiconductor (MOS) capacitor 203, and a polysilicon resistor 204.

CMOS invertor 201 comprises PMOS transistors 205 and 206 and NMOS transistor 207. Exemplary sizes of transistors 205–207 are respectively, given in the familiar width-to-length ratios, 7/0.9, 7/1.2 and 8/1.2 (microns). The input signal of input buffer 200 is provided to the gate terminals of transistors 205 and 207. The output signal OUT of input buffer 200 is taken from the commonly connected drain terminals of transistors 206 and 207. CMOS invertor 202 mirrors CMOS inventors 201. As shown in FIG. 2, PMOS transistors 208 and 209, and NMOS transistor 210 of CMOS inventer 202 correspond one- to-one with PMOS transistors 205 and 206, and NMOS transistor 207. The gate terminals of transistors 208 and 210 receives a reference voltage VBIAS, which is insensitive to variations in a number of operational or environmental parameters (see below). The gate terminal of transistor 209 which is connected to the gate terminal of transistor 206 through an RC circuit formed by decoupling capacitor 203 and a resistor 204. The gate and drain terminals of transistor 209 are connected together. In the embodiment shown in FIG. 2, decoupling capacitor 203 is an NMOS capacitor having a size of 240/10 to achieve a value of approximately 5 picofarads, and resistor 204 is a polysilicon resistor having an approximate resistance of 10 Kohms. A suitable reference voltage for signal VBIAS of input buffer 200 is 1.6 volts.

CMOS invertors 201 and 202 form a differential amplifier so that the threshold voltage of the invertor formed by transistors 205–207 is matched to the reference voltage VBIAS. In other words, if the input signal IN on lead 211 exceeds the reference voltage VBIAS, the output signal OUT on lead 212 goes to logic low. Conversely, if the input signal IN on lead 211 falls below the reference signal VBIAS, the output signal OUT on lead 212 goes to logic high. During operation, decoupling capacitor 203 couples ground noise to terminal 213 so as to maintain substantially constant the conductivity ratio between NMOS transistor 207 and the combination of PMOS transistors 205 and 206. As a result, the threshold voltage remains constant independent of the ground noise. Since the reference voltage VBIAS is designed to be insensitive to temperature and supply voltage variations, the threshold voltage of input buffer 200 is independent of temperature and supply voltage variations and ground noise. Further, because the pull-up current through PMOS transistors 205 and 206 of input buffer 200 is reflected from the CMOS inverter 202 which current is limited by NMOS transistor 210 having a gate-to-source voltage of 1.6 volt (VBIAS), the pull up current will not change with fluctuation in the supply voltage. Consequently, the rise time of the output voltage on lead 212 is determined substantially by the RC time constant of the series resistance represented by PMOS transistor 205 and 206, and the output capacitive load. The fall time of the output voltage on lead 212 can be similarly limited, resulting in the input buffer 200 having symmetrical rise and fall times.

It should be noted that, if the input signal on lead 211 is equal to the supply voltage $V_{cc}$, PMOS transistor 205 is turned off, such that the current in PMOS transistor 205 is zero. Thus, the input buffer 200 of the present invention is fully compatible with conventional CMOS input buffers, i.e. like a conventional CMOS input buffer, e.g. CMOS inverter 100 of FIG. 1, input buffer 200 will not draw any current under full $V_{cc}$ swing operation.

Figure 3:
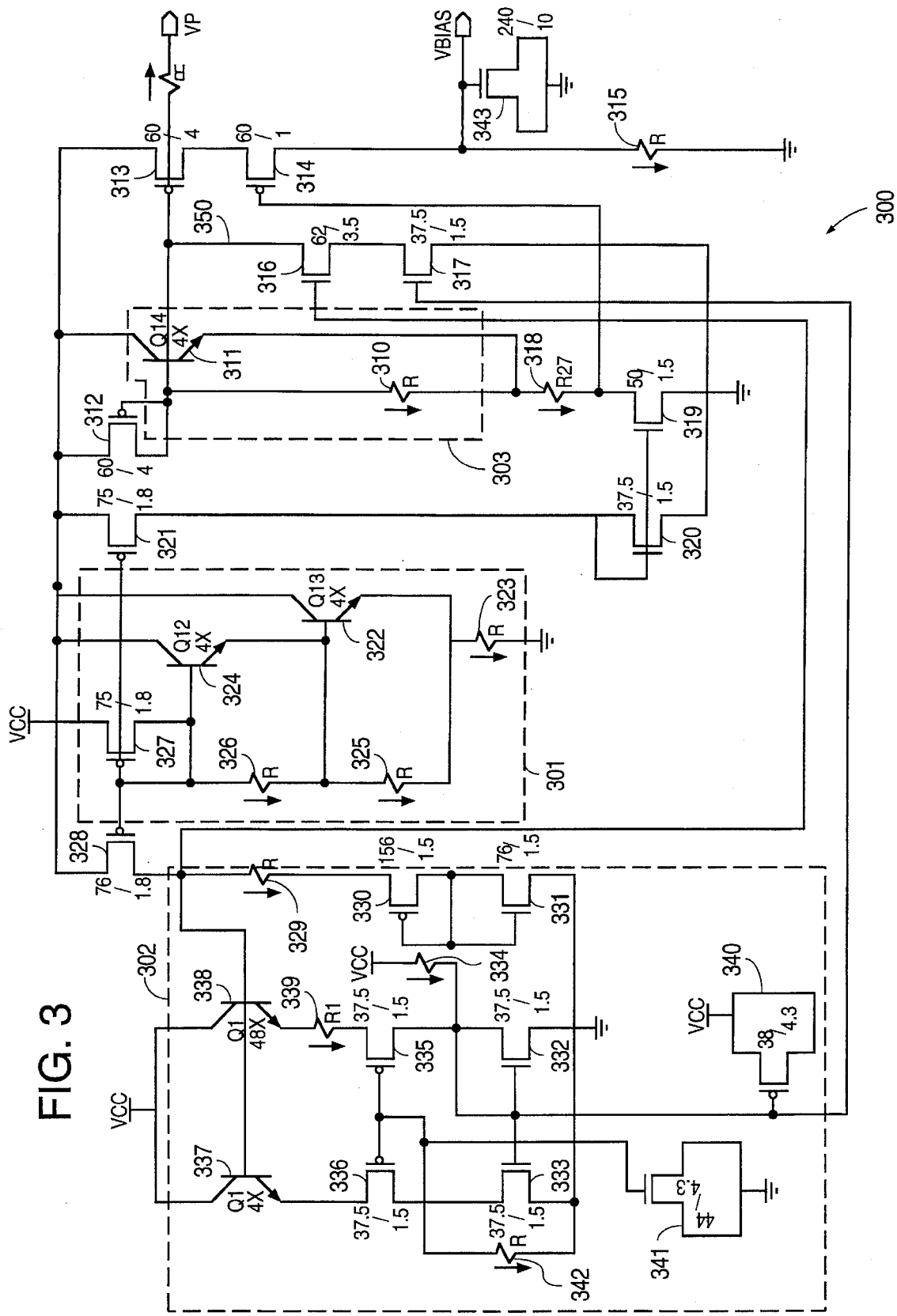
FIG. 3 shows a circuit 300 for generating a reference voltage insensitive to changes in environmental parameters, in accordance with the present invention.

To provide a reference voltage which is independent of temperature and supply voltage variations, a band gap type voltage regulator can be used. FIG. 3 shows an example of such a voltage regulator 300. Voltage regulator 300 can be fabricated in a process which allows an N-type substrate to form the common collectors of all the lateral NPN bipolar transistors shown in FIG. 3.

The reference voltage VBIAS is achieved by a current which magnitude depends on a linear combination of two quantities "$V_{BE}$" and "$\delta V_{BE}$," where $V_{BE}$ is the relatively constant base-to-emitter voltage in a bipolar transistor and $\delta V_{BE}$, is the voltage difference between the base-to-emitter voltages of two bipolar transistors of difference current densities. Current density in this instance is defined as the collector current per unit area (emitter area). Because the temperature coefficients (i.e. the variations in voltage per degree of temperature change) of $V_{BE}$ and $\delta V_{BE}$ have opposite signs, by suitably weighing $V_{BE}$ and $\delta V_{BE}$, the reference voltage VBIAS can be made insensitive to temperature fluctuation.

Voltage regulator 300, which provides the reference voltage VBIAS can be seen to comprise three functional blocks 301, 302 and 303. Functional block 301 comprises PMOS transistor 327, NPN transistors 322 and 324, and resistors 323, 325 and 326. Because the base-to-emitter voltage of NPN transistors 322 is relatively constant the current in resistor 325 is relatively constant, so as to provide a relatively constant emitter current for NPN transistor 324. Thus, the $V_{BE}$ and the base current of NPN transistor 324 are relatively constant and independent of fluctuation in the supply voltage. In fact, because of the gain of NPN transistor 324, the base current is negligible. Consequently, the current in PMOS transistor 327, which is determined by the resistance of resistor 326, is independent of fluctuation in the supply voltage. This current in PMOS transistor 327 is reflected by PMOS transistor 328 to flow in resistor 329, thereby setting up a substantially constant voltage at the common bases of NPN transistors 337 and 338 of functional block 302.

Functional block 302 provides a current which is dependent upon the quantity $\delta V_{BE}$. This $\delta V_{BE}$ is provided by the difference in the base-to-emitter voltages of NPN transistors 337 and 338. The difference in base-to-emitter voltages result from the relative sizes (i.e. ratio of emitter areas) of NPN transistors 337 and 338. For a size ratio of 1:10 between the sizes of bipolar transistors 337 and 338, a $\delta V_{BE}$ of 60 millivolts can be obtained. This $\delta V_{BE}$ voltage is dropped across resistor 339, which determines the current flowing through NPN transistors 337 and 338. As shown in FIG. 3, resistor 339 has a resistance value of approximately 1.6 Kilohms. Resistors 334 and 342, PMOS transistors 335 and 336, NMOS transistors 332 and 333, and MOS capacitors 340 and 341 form a start-up circuit to ensure that the current in resistor 339 ("$\delta V_{BE}$ current") can be bootstrapped at power up. At power up, resistor 334 ensures that NMOS transistors 332 and 333 are turned on. Likewise, resistor 342 ensures that PMOS transistors 335 and 336 are turned on. Resistors 334 and 342 can each be made from a "cell resistor" having very high resistance. MOS capacitors 340 and 341 are provided to eliminate the effect of fluctuation in the supply voltage on the $\delta V_{BE}$ current. The $\delta V_{BE}$ current is reflected by NMOS transistor 317 to lead 350. Transistor 316 and transistor 317 are "stacked" (i.e. connected in series) to eliminate the effect of channel length modulation in the $\delta V_{BE}$ current of lead 350. This is because the relatively constant current through NMOS transistors 316 and 317 restricts the gate-to-source voltages of transistors NMOS 316 and 317, thereby restricting the voltage fluctuation at the node between the drain terminal of the NMOS transistor 317 and the source terminal of NMOS transistor 316. PMOS transistor 330 and NMOS transistor 331 are designed to match PMOS transistor 335 and NMOS transistor 332, and resistor 329 is designed to match resistor 326. Because the current through resistor 326 is relatively constant, and because this current through transistor 329 is reflected in resistor 326, the voltage drop across resistor 329 will provide a constant common base voltage for NPN transistors 337 and 338 with respect to ground, independent of supply voltage and device variations.

In functional block 303, the relatively constant current of PMOS transistor 327 is reflected by NMOS transistors 320 and 321 to set up the base-to-emitter voltage of NPN transistor 311. This base-to-emitter voltage of NPN transistor 311 is dropped across resistor 310, so that the current through resistor 310 (the "$V_{BE}$ current") is relatively constant. Since the emitter current of NPN transistor 311 is small and constant, the base current of NPN transistor 311 is negligible. As shown in FIG. 3, resistor 310 has a value of 16 Kilohms, and NPN transistor 311 has the same size as NPN transistor 337 of functional block 302. Both the $V_{BE}$ current in resistor 310 and the $\delta V_{BE}$ current of lead 350 are drawn from the current (the "VBIAS" current) through PMOS transistor 312. Both the relative sizes of NPN transistors 311, 337 and 338, and the relative sizes of resistors 310 and 339 are designed such that the temperature variation responses of the $V_{BE}$ current and the $\delta V_{BE}$ current are matched, so as to provide a VBIAS current independent of temperature. The VBIAS current in PMOS transistor 312 is reflected by PMOS transistor 313 to flow through PMOS transistor 314 and resistor 315. As shown in FIG. 3, resistor 315 has a Value of 18.6 Kilohms to provide an-output voltage VBIAS of approximately 1.6 volts. Transistor 314 is provided to eliminate channel length modulation effect by constraining the voltage fluctuation in the node between the drain terminal of PMOS transistor 313 and the source terminal of PMOS transistor 314, in the same manner as discussed above with respect to NMOS transistor 316 and 317.

The constant current generated in PMOS transistor 313 can be replicated, using the current reflection techniques discussed hereinabove, in other parts of the integrated circuit to provide a constant current having the desirable properties of the present invention.

The above detailed description is provided to illustrate the specific embodiments described herein and it is not intended to be limiting of the present invention. Within the scope of the present invention, many variations and modifications are possible. For example, other means for providing a reference voltage insensitive to the relevant certain operational conditions can also be used. The present invention is set forth in the following claims.

I claim:

1. An input buffer, comprising:

a first PMOS transistor having a drain terminal, a source terminal receiving a positive power supply voltage, and a gate terminal coupled to receive an input signal;

means for receiving a reference voltage which is insensitive to supply voltage fluctuations and for providing on an output lead a control voltage in accordance with said reference voltage;

a second PMOS transistor having a drain terminal, a source terminal connected to said drain terminal of said first PMOS transistor, and a gate terminal coupled to receive said control voltage; and an NMOS transistor having a drain terminal connected to said drain terminal of said second PMOS transistor, a gate terminal coupled to receive said input signal, said drain terminal of said NMOS transistor providing an output signal of said input buffer.

2. An input buffer as in claim 1, further comprising a resistor connected between said output lead of said means for receiving and said gate terminal of said second PMOS transistor.

3. A method for providing an input, buffer, comprising the steps of:

providing a first PMOS transistor having a drain terminal, a source terminal receiving a positive power supply voltage, and a gate terminal coupled to receive an input signal;

receiving a reference voltage which is insensitive to supply voltage variations and providing on an output lead a control voltage in accordance with said reference voltage;

providing a second PMOS transistor having a drain terminal, a source terminal connected to said drain terminal of said first PMOS transistor, and a gate terminal coupled to receive said control voltage; and providing an NMOS transistor having a drain terminal connected to said drain terminal of said second PMOS transistor, a gate terminal coupled to receive said input signal, said drain terminal of said NMOS transistor providing an output signal of said input buffer.

4. A method as in claim 3, further comprising the step of providing a resistor connected between said output lead and said gate terminal of said second PMOS transistor.

5. An input buffer as in claim 1, further comprising a circuit coupling said gate terminal of said second PMOS transistor to a voltage fluctuation in a common ground voltage.

6. A method as in claim 3, further comprising the step of providing a circuit coupling said gate terminal of said second PMOS transistor to a voltage fluctuation in a common ground voltage.

7. An input buffer as in claim 1, wherein said reference voltage is independent of operating temperature.

8. A method as in claim 3, wherein said reference voltage is independent of operating temperature.

* * * * *